United States Patent
Chen et al.

(10) Patent No.: US 8,975,184 B2
(45) Date of Patent: Mar. 10, 2015

(54) METHODS OF IMPROVING TUNGSTEN CONTACT RESISTANCE IN SMALL CRITICAL DIMENSION FEATURES

(75) Inventors: Feng Chen, Milpitas, CA (US); Tsung-Han Yang, San Jose, CA (US); Juwen Gao, San Jose, CA (US); Michal Danek, Cupertino, CA (US)

(73) Assignee: Novellus Systems, Inc., Fremont, CA (US)

( * ) Notice: Subject to any disclaimer, the term of this patent is extended or adjusted under 35 U.S.C. 154(b) by 51 days.

(21) Appl. No.: 13/560,688

(22) Filed: Jul. 27, 2012

(65) Prior Publication Data
US 2014/0030889 A1    Jan. 30, 2014

(51) Int. Cl.
*H01L 21/768* (2006.01)

(52) U.S. Cl.
USPC ........... 438/675; 438/680; 438/685; 438/656; 257/E21.171; 247/E21.171

(58) Field of Classification Search
CPC .................. H01L 21/76877; H01L 21/28562; H01L 21/28556
USPC ......... 438/675, 674, 597, 584, 680, 685, 656; 257/E21.171; 247/E21.17
See application file for complete search history.

(56) References Cited

U.S. PATENT DOCUMENTS

| | | | |
|---|---|---|---|
| 4,746,375 A | 5/1988 | Lacovangelo | |
| 4,804,560 A | 2/1989 | Shioya et al. | |
| 4,874,719 A | 10/1989 | Kurosawa | |
| 5,028,565 A | 7/1991 | Chang et al. | |
| 5,227,329 A | 7/1993 | Kobayashi et al. | |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,926,720 A | 7/1999 | Zhao et al. | |

(Continued)

FOREIGN PATENT DOCUMENTS

| | | |
|---|---|---|
| JP | 2009-144242 | 7/2009 |
| KR | 20050022261 | 3/2005 |

(Continued)

OTHER PUBLICATIONS

Korean Office Action, dated Jun. 13, 2011, issued in Application No. 2011-0032098.
Chinese Office Action dated Sep. 18, 2012 issued in application No. 200980133560.1.
Korean Office Action dated Mar. 21, 2013 issued in KR Application No. 2010-0024905.

(Continued)

*Primary Examiner* — Brett Feeney
*Assistant Examiner* — Damian A Hillman
(74) *Attorney, Agent, or Firm* — Weaver Austin Villeneuve & Sampson LLP

(57) ABSTRACT

Methods of filling features with low-resistivity tungsten layers having good fill without use of a nucleation layer are provided. In certain embodiments, the methods involve an optional treatment process prior to chemical vapor deposition of tungsten in the presence of a high partial pressure of hydrogen. According to various embodiments, the treatment process can involve a soaking step or a plasma treatment step. The resulting tungsten layer reduces overall contact resistance in advanced tungsten technology due to elimination of the conventional tungsten nucleation layer.

19 Claims, 10 Drawing Sheets

(56) References Cited

U.S. PATENT DOCUMENTS

| | | | |
|---|---|---|---|
| 5,956,609 A | 9/1999 | Lee et al. | |
| 6,001,729 A | 12/1999 | Shinriki et al. | |
| 6,017,818 A | 1/2000 | Lu | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,262,125 B2 | 8/2007 | Wongsenakhum et al. | |
| 7,416,979 B2 | 8/2008 | Yoon et al. | |
| 7,429,402 B2 | 9/2008 | Gandikota et al. | |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,101,521 B1 | 1/2012 | Gao et al. | |
| 8,207,062 B2 | 6/2012 | Gao et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2006/0003581 A1 | 1/2006 | Johnston et al. | |
| 2006/0094238 A1 | 5/2006 | Levy et al. | |
| 2007/0099420 A1 | 5/2007 | Dominguez et al. | |
| 2007/0190780 A1 | 8/2007 | Chung et al. | |
| 2008/0045010 A1 | 2/2008 | Wongsenakhum et al. | |
| 2008/0081127 A1 | 4/2008 | Thompson et al. | |
| 2008/0124926 A1 | 5/2008 | Chan et al. | |
| 2008/0254623 A1 | 10/2008 | Chan et al. | |
| 2008/0280438 A1 | 11/2008 | Lai et al. | |
| 2009/0149022 A1 | 6/2009 | Chan et al. | |
| 2009/0160030 A1 | 6/2009 | Tuttle | |
| 2009/0163025 A1* | 6/2009 | Humayun et al. | 438/675 |
| 2010/0035427 A1 | 2/2010 | Chan et al. | |
| 2010/0055904 A1 | 3/2010 | Chen et al. | |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |
| 2012/0244699 A1* | 9/2012 | Khandelwal et al. | 438/653 |

FOREIGN PATENT DOCUMENTS

| | | |
|---|---|---|
| KR | 20050087428 | 8/2005 |
| WO | WO01/27347 | 4/2001 |
| WO | WO 2005/027211 | 3/2005 |
| WO | WO2007/121249 | 10/2007 |
| WO | WO2010/025357 | 3/2010 |

OTHER PUBLICATIONS

Korean Office Action dated Mar. 4, 2013 in KR Application No. 2010-0035449.

Korean Office Action dated Mar. 4, 2013 in KR Application No. 2010-0035453.

Notice of Allowance dated Dec. 3, 2012, issued in U.S. Appl. No. 13/095,734.

US Office Action, dated Jan. 7, 2013, issued in U.S. Appl. No. 12/202,126.

Notice of Allowance dated Nov. 29, 2012, issued in U.S. Appl. No. 13/244,016.

US Office Action, dated Feb. 15, 2013, issued in U.S. Appl. No. 12/755,248.

US Office Action dated Dec. 18, 2012, issued in U.S. Appl. No. 12/723,532.

US Final Office Action, dated Nov. 16, 2012, issued in U.S. Appl. No. 13/020,748.

US Patent Application titled "CVD Based Metal/Semiconductor Ohmic Contact for High Volume Manufacturing Applications," filed Apr. 12, 2013, U.S. Appl. No. 13/862,048.

U.S. Appl. No. 13/758,928, filed Feb. 4, 2013, entitled "Methods for Forming All Tungsten Contacts and Lines."

U.S. Appl. No. 13/774,350, filed Feb. 22, 2013, entitled "Tungsten Feature Fill With Nucleation Inhibition."

U.S. Appl. No. 13/851,885, filed Mar. 27, 2013, entitled "Tungsten Feature Fill."

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

(56) References Cited

OTHER PUBLICATIONS

Klaus et al., "Atomic layer deposition of tungsten using sequential surface chemistry with a sacrificial stripping reaction", Thin Solid Films 360 (2000) 145-153.
Klaus et al., "Atomically Controlled Growth of Tungsten and Tungsten Nitride Using Sequential Surface Reactions," Applied Surface Science, 162-163, (2000) 479-491.
Li et al., "Deposition of $WN_XC_y$ Thin Films by ALCVD™ Method for Diffusion Barriers in Metallization," IITC Conference Report, 2002, 3 Pages.
Elam et al, "Nucleation and Growth During Tungsten Atomic Layer Deposition on $SiO_2$ Surfaces," Thin Solid Films, 2001, 13 Pages.
Collins et al., "Pulsed Deposition of Ultra Thin Tungsten for Plugfill of High Aspect Ratio Contacts," Presentation made at Semicon Korea 2003, Jan. 21, 2003, 9 pages.
Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.
Lee et al., Pulsed Deposition of Ultra Thin Tungsten and its Application for Plugfill of High Aspect Ratio Contacts, Abstract, Jan. 21, 2003, 1 page.
Wongsenakhum et al., "Method of Forming Low-Resistivity Tungsten Interconnects," Novellus Systems, Inc., U.S. Appl. No. 10/815,560, filed Mar. 31, 2004.
U.S. Office Action mailed Jul. 12, 2005, from U.S. Appl. No. 10/815,560.
Lee et al., "Method for Producing Ultra Thin Tungsten Layer With Improved Step Coverage," Novellus Systems, Inc., U.S. Appl. No. 09/975,074, filed Oct. 9, 2001.
U.S. Office Action mailed Jul. 17, 2002, from U.S. Appl. No. 09/975,074.
Lee et al., "Method for Producing Ultra Thin Tungsten Layer With Improved Step Coverage," Novellus Systems, Inc., U.S. Appl. No. 10/649,351, filed Aug. 26, 2003.
U.S. Office Action mailed Feb. 8, 2005, from U.S. Appl. No. 10/649,351.
U.S. Final Office Action mailed Jul. 14, 2005, from U.S. Appl. No. 10/649,351.
Presentation by Inventor James Fair: "Chemical Vapor Deposition of Refractory Metal Silicides," 27 Pages, 1983.
Saito et al., "A Novel Copper Interconnection Technology Using Self Aligned Metal Capping Method," IEEE, 3 Pages, 2001.
Fair et al., "Selective Refractory Metal and Nitride Capping," Novellus Systems, Inc., U.S. Appl. No. 10/435,010, filed May 9, 2003.
U.S. Office Action mailed Jun. 22, 2004, from U.S. Appl. No. 10/435,010.
Levy et al., "Deposition of Tungsten Nitride," Novellus Systems, Inc., U.S. Appl. No. 10/690,492, filed Oct. 20, 2003.
U.S. Office Action mailed Mar. 23, 2005, from U.S. Appl. No. 10/690,492.
Fair et al., "Selective Refractory Metal and Nitride Capping," Novellus Systems, Inc., U.S. Appl. No. 10/984,126, filed Nov. 8, 2004.
U.S. Office Action mailed Nov. 23, 2005, from U.S. Appl. No. 10/984,126.
Levy et al., "Deposition of Tungsten Nitride", Novellus Systems, Inc., filed Dec. 16, 2005, U.S. Appl. No. 11/305,368, pp. 1-39.
U.S. Final Office Action mailed Dec. 28, 2005, from U.S. Appl. No. 10/815,560.
U.S. Office Action mailed Dec. 30, 2005, from U.S. Appl. No. 10/649,351.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.
U.S. Office Action mailed Apr. 17, 2006, from U.S. Appl. No. 10/815,560.
U.S. Final Office Action mailed May 17, 2006, from U.S. Appl. No. 10/984,126.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Chan et al., "Methods for Growing Low-Resistivity Tungsten for High Aspect Ratio and Small Features," Novellus Systems, Inc., U.S. Appl. No. 12/030,645, filed Feb. 13, 2008.
Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S Appl. No. 09/975,074.
Notice of Allowance and Fee Due mailed Jul. 21, 2006, from U.S Appl. No. 10/649,351.
Notice of Allowance and Fee Due mailed Oct. 7, 2004, from U.S Appl. No. 10/435,010.
Notice of Allowance and Fee Due mailed Aug. 25, 2006, from U.S Appl. No. 10/984,126.
Notice of Allowance and Fee Due mailed Sep. 14, 2005, from U.S Appl. No. 10/690,492.
Notice of Allowance and Fee Due mailed Apr. 24, 2007, from U.S Appl. No. 10/815,560.
U.S. Office Action mailed Jun. 27, 2008, from U.S. Appl. No. 11/305,368.
Chan et al., "Methods for Growing Low-Resistivity Tungsten Film," Novellus Systems, Inc., U.S. Appl. No. 11/265,531, filed Nov. 1, 2005.
U.S. Office Action mailed Aug. 21, 2008, from U.S. Appl. No. 11/265,531.
Ashtiani et al., "Ternary Tungsten-Containing Thin Film Heater Elements," Novellus Systems, Inc., U.S. Appl. No. 61/025,237, filed Jan. 31, 2008.
Chen et al., "Method for Reducing Tungsten Roughness and Improving Reflectivity," Novellus Systems, Inc., U.S. Appl. No. 12/202,126, filed Aug. 29, 2008.
U.S. Office Action mailed Oct. 16, 2008, from U.S. Appl. No. 11/349,035.
U.S. Office Action mailed Sep. 29, 2008, from U.S. Appl. No. 11/782,570.
Ashtiani et al., "Ternary Tungsten-Containing Thin Films," Novellus Systems, Inc., U.S. Appl. No. 12/363,330, filed Jan. 30, 2009.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
U.S. Final Office Action mailed Apr. 28, 2009, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
U.S. Notice of Allowance mailed May 4, 2009 from U.S. Appl. No. 11/265,531.
U.S. Final Office Action mail Feb. 25, 2009, from U.S. Appl. No. 11/349,035.
U.S. Office Action mailed Jun. 11, 2009, from U.S. Appl. No. 11/963,698.
U.S. Office Action mailed Jun. 4, 2009, from U.S. Appl. No. 11/349,035.
Ken K. Lai and H. Henry Lamb, Precursors for Organometallic Chemical Vapor Deposition of Tungsten Carbide Films, 1995, Chemistry Material, pp. 2284-2292.
U.S. Office Action mailed Jun. 24, 2009 from U.S. Appl. No. 12/030,645.
U.S. Office Action mailed Aug. 5, 2009 from U.S. Appl. No. 11/951,236.
Ashtiani et al., "Ternary Tungsten-Containing Resistive Thin Films," Novellus Systems, Inc., U.S. Appl. No. 12/363,330, filed Jan. 30, 2009.
Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.

(56) References Cited

OTHER PUBLICATIONS

U.S. Office Action mailed Oct. 21, 2009 from U.S. Appl. No. 12/202,126.
U.S. Notice of Allowance mailed Nov. 17, 2009 from U.S. Appl. No. 11/305,368.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Chan et al., "Methods for Growing Low-Resistivity Tungsten Film1", Novellus Systems Inc., U.S. Appl. No. 12/538,770, filed Aug. 10, 2009.
U.S. Final Office Action mailed Jan. 13, 2010 from U.S. Appl. No. 12/030,645.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Office Action mailed Jan. 26, 2010 from U.S. Appl. No. 11/951,236.
U.S. Notice of Allowance mailed Mar. 2, 2010 from U.S. Appl. No. 11/349,035.
Danek, et al, "Tungsten Barrier and Seed for Copper Filled TSV," Novellus Systems, Inc., filed Mar. 12, 2010, U.S. Appl. No. 12/723,532.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
U.S. Notice of Allowance mailed Apr. 6, 2010 from U.S. Appl. No. 11/951,236.
U.S. Office Action mailed May 3, 2010 from U.S. Appl. No. 12/407,541.
U.S. Final Office Action mailed May 7, 2010 from U.S. Appl. No. 12/202,126.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Final Office Action mailed Jul. 23, 2010 from U.S. Appl. No. 12/030,645.
U.S. Office Action mailed Jul. 26, 2010 from U.S. Appl. No. 12/202,126.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Final Office Action for U.S. Appl. No. 11/963,698 mailed Dec. 30, 2010.
U.S. Office Action for U.S. Appl. No. 12/636,616 mailed Jan. 25, 2011.
U.S. Final Office Action mailed Feb. 7, 2011 from U.S. Appl. No. 12/202,126.
Notice of Allowance and Fee Due mailed Jan. 24, 2011, from U.S Appl. No. 12/030,645.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/407,541 mailed May 2, 2011.
U.S. Office Action for U.S. Appl. No. 12/755,248 mailed May 13, 2011.
U.S. Office Action for U.S. Appl. No. 12/556,490 mailed Jun. 14, 2011.
U.S. Final Office Action for U.S. Appl. No. 12/636,616 mailed Jun. 15, 2011.
Notice of Allowance for U.S. Appl. No. 12/538,770 mailed Jun. 30, 2011.
U.S. Office Action for U.S. Appl. No. 12/829,119, mailed Jun. 30, 2011.
Notice of Allowance mailed Jul. 25, 2011, for U.S. Appl. No. 12/363,330.
Korean First Notification of Provisional Rejection mailed Dec. 8, 2010, dated Application No. 2004-0036346.
Notice of Allowance mailed Sep. 2, 2011, for U.S. Appl. No. 11/963,698.
Notice of Allowance mailed Sep. 19, 2011, for U.S. Appl. No. 12/407,541.
Chan et al., "Methods of Controlling Tungsten Film Properties," Novellus Systems, Inc., U.S. Appl. No. 13/020,748, filed Feb. 3, 2011.
Chandrashekar et al., "Method for Depositing Thin Tungsten Film With Low Resistivity and Robust Micro-Adhesion Characteristics," Novellus Systems, Inc., U.S. Appl. No. 13/244,016, filed Sep. 23, 2011.
U.S. Office Action for U.S. Appl. No. 12/755,248 mailed Oct. 28, 2011.
Notice of Allowance for U.S. Appl. No. 12/636,616 mailed Sep. 30, 2011.
Humayun et al., "Methods for Forming All Tungsten Contacts and Lines," Novellus Systems, Inc., U.S. Appl. No. 13/276,170, filed Oct. 18, 2011.
U.S. Final Office Action for U.S. Appl. No. 12/829,119, mailed Nov. 17, 2011.
U.S. Appl. No. 12/755,259, Office Action mailed Feb. 16, 2012.
Notice of Allowance for U.S. Appl. No. 12/556,490 mailed Mar. 2, 2012.
U.S. Office Action, dated May 10, 2012, issued in U.S. Appl. No. 13/020,748.
U.S. Office Action for U.S. Appl. No. 13/244,016, mailed Mar. 6, 2012.
U.S. Office Action for U.S. Appl. No. 12/829,119, mailed Apr. 19, 2012.
U.S. Office Action for U.S. Appl. No. 13/276,170, mailed Apr. 16, 2012.
U.S. Final Office Action for U.S. Appl. No. 12/755,248 mailed Apr. 30, 2012.
Notification of Provisional Rejection mailed Jul. 17, 2012, for Application No. 2010-0087997.
Office Action for U.S. Appl. No. 13/095,734, mailed Aug. 6, 2012.
Notice of Allowance for U.S. Appl. No. 12/829,119, mailed Aug. 7, 2012.
Notification of Provisional Rejection mailed Sep. 6, 2012, for Application No. 2011-7004322.
U.S. Final Office Action dated Sep. 12, 2012 issued in U.S. Appl. No. 12/755,259.
US Notice of Allowance, dated Oct. 4, 2012, issued in U.S. Appl. No. 13/276,170.
US Office Action, dated Sep. 12, 2012, issued in U.S. Appl. No. 12/755,259.
U.S. Appl. No. 13/633,502, filed Oct. 2, 2012, entitled "Method for Producing Ultra-Thin Tungsten Layers With Improved Step Coverage."
U.S. Appl. No. 13/633,798, filed Oct. 2, 2012, entitled "Method for Depositing Tungsten Film With Low Roughness and Low Resistivity."

* cited by examiner

METHODS OF IMPROVING TUNGSTEN CONTACT RESISTANCE IN SMALL CRITICAL DIMENSION FEATURES

BACKGROUND

The deposition of tungsten films using chemical vapor deposition (CVD) techniques is an integral part of many semiconductor fabrication processes. The tungsten films may be used to produce low resistance electrical connections in the form of horizontal interconnects, vias between adjacent metal layers, and contacts between a first metal layer and the devices on a substrate. In a conventional tungsten deposition process on a semiconductor wafer, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. The bulk layer is generally deposited more rapidly than the nucleation layer, but cannot be produced easily and reliably without first forming the nucleation layer.

Increasingly thin tungsten electrical connects having very low resistance will enable smaller critical dimension devices. Although CVD and other methods are able to deposit nucleation layers, their ability to provide nucleation layers for the deposition of low resistivity tungsten in small critical dimension features is limited. Void-free fill in aggressive features is problematic using conventional CVD tungsten deposition techniques.

SUMMARY

Provided are novel methods of filling features in small critical dimension features to yield void-free tungsten layers with good feature fill and uniformity. The methods involve depositing a bulk tungsten layer directly in a feature without a nucleation layer. According to various embodiments, the methods can include one or more of treating the feature surface prior to deposition of the bulk layer and using a high partial pressure of hydrogen ($H_2$) or other reducing agent during chemical vapor deposition (CVD) of the bulk layer.

In one aspect, a method of filling a recessed feature on a substrate is provided. The method includes treating a surface of the unfilled feature prior to depositing any tungsten in the feature, and filling the feature with a tungsten film in a CVD process. The CVD process involves directly exposing the treated surface to a tungsten-containing precursor and hydrogen, at a partial pressure of hydrogen of at least about 40 Torr.

Using this process, high quality fill and uniformity in the feature is achieved without a nucleation layer, and the feature has an overall lower resistance than features that include a nucleation layer. In some embodiments, the width of the feature is less than about 50 nm or less than about 30 nm prior to tungsten film deposition. In certain embodiments, the feature surface includes a barrier or liner layer such as tungsten nitride or titanium nitride. According to various embodiments, the partial pressure of hydrogen is at least about 60 Torr or at least about 80 Torr during the CVD process.

In some embodiments, treating the surface of the feature involves soaking the substrate in a reducing agent. Examples of reducing agents include boranes, silanes, and germanes. In some embodiments, the surface is treated by soaking for about 2 to 10 seconds. The soaking operation may be a non-plasma thermal operation.

In some embodiments, treating the surface of the feature involves exposing the surface to an inert gas-containing plasma. In some embodiments, the inert gas-containing plasma includes argon and hydrogen species. Also in some embodiments, the substrate is kept under vacuum between treating the surface of the feature and filling the feature with a tungsten film in the CVD process.

Another aspect relates to a method of filling a recessed feature on a substrate including, prior to depositing any tungsten in the feature, exposing a surface of the feature to an inert gas-containing plasma; and filling the feature with tungsten in a CVD process by directly exposing the treated surface to a tungsten-containing precursor and a reducing agent in a CVD chamber. The feature surface in various embodiments includes barrier or liner layers such as a tungsten nitride or titanium nitride barrier layer.

The substrate may be kept under vacuum between the plasma treatment and the CVD process. According to some embodiments, the method is practiced by exposing the surface of the feature to an inert gas-containing plasma in a treatment chamber separate from the CVD chamber.

Also according to various embodiments, a liner layer may be deposited in the feature in a liner layer deposition chamber prior to the plasma treatment, with the plasma treatment occurring in the same liner layer deposition chamber before the substrate is transferred to the CVD chamber. In some embodiments, the liner layer is a tungsten nitride liner layer or titanium nitride liner layer. The liner layer may be deposited by a plasma-enhanced atomic layer deposition (ALD) process for example.

Another aspect relates to methods of filling a recessed feature on a substrate involving filling the feature with a tungsten film by exposing the substrate to a tungsten-containing precursor and hydrogen in a CVD process. The partial pressure of $H_2$ during the CVD process can be at least about 40 Torr, or at least 60 Torr, or at least 70 Torr.

Another aspect relates to an apparatus for filling a recessed feature on a substrate. In some embodiments, the apparatus is a multi-chamber apparatus including a pretreatment chamber, a CVD chamber that includes a substrate support and one or more gas inlets configured to expose the substrate to gases, and a controller for controlling the operations in the apparatus, including machine readable instructions for: treating the substrate in the pretreatment chamber; transferring the substrate from the pretreatment chamber to the CVD chamber; and filling the feature with tungsten by exposing the substrate in the CVD chamber to a tungsten-containing precursor by a CVD process while maintaining a partial pressure of hydrogen of at least about 40 Torr. In some embodiments, the controller further includes instructions for maintaining a substrate temperature between about 200° C. and 450° C. during the CVD process.

In some embodiments, the pretreatment chamber includes a substrate support and one or more gas inlets, and the controller further includes instructions for inletting a reducing agent to the pretreatment chamber. Example reducing agent exposure times range from about 2 to 10 seconds. In various embodiments, the pretreatment chamber includes a substrate support and one or more gas inlets and also a plasma generator, and the controller further includes instructions to generate an inert gas-containing plasma in the pretreatment chamber.

These and other aspects are described further below with reference to the drawings.

DETAILED DESCRIPTION

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Introduction

As the critical dimension of logic, memory and other devices shrinks, increasingly thin tungsten electrical connects having very low resistance will become important. Void-free, low resistivity tungsten in sub-32 nm features is critical for maintaining via or contact performance and reliability in both memory and logic devices.

Conventional tungsten deposition techniques typically involve depositing a tungsten nucleation layer in the features of substrates before a bulk tungsten layer is deposited. Nucleation layers often contain impurities, such as boron or silicon. The tungsten nucleation layers also have high resistivity—typically over 100 μΩ-cm. However, in conventional techniques, deposition of a tungsten bulk layer without a nucleation layer results in severely long nucleation delay, poor uniformity, and poor feature fill. Poor deposition occurs in wafers with or without various liner layers. Nucleation delay can be defined as the time between when the tungsten deposition process begins and when the film begins to appear. Thicker nucleation layers can be implemented to obtain better plug fill with conventional techniques, but at a cost of higher overall resistance. However, depositing thinner nucleation layers, which decreases the amount of high-resistivity tungsten in the feature, results in poor uniformity and feature fill due to nucleation delay.

Figure 1A:
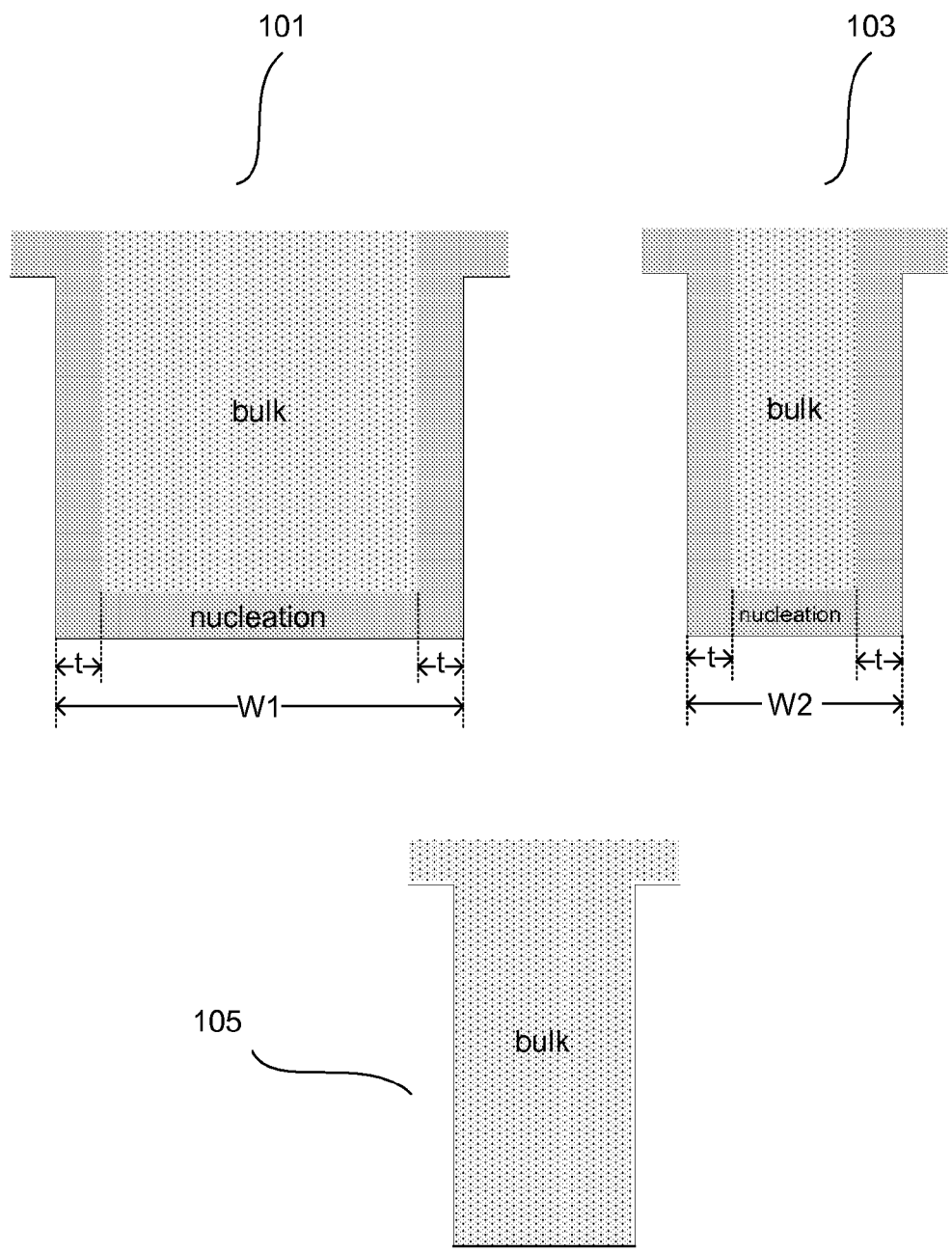
FIG. 1A shows simplified cross-sectional diagrams of tungsten deposition in small and large critical dimension features according to various embodiments.

For narrow width and/or small critical dimension features, obtaining thin nucleation layers is even more critical. FIG. 1A shows a relatively large critical dimension feature 101 in comparison to a relatively small critical dimension feature 103. (These features are not drawn to scale but to illustrate the qualitative difference between nucleation layers in large and small critical dimension features.) Here, the thickness t of the nucleation layer is the same for both features 101 and 103, but the width W2 of feature 103 is much less than width W1 of feature 101, and the nucleation layer takes up a significantly higher percentage of the total volume of the feature 103. As a result, the nucleation layer has a much higher relative contribution to the overall resistance of the feature.

Figure 1B:
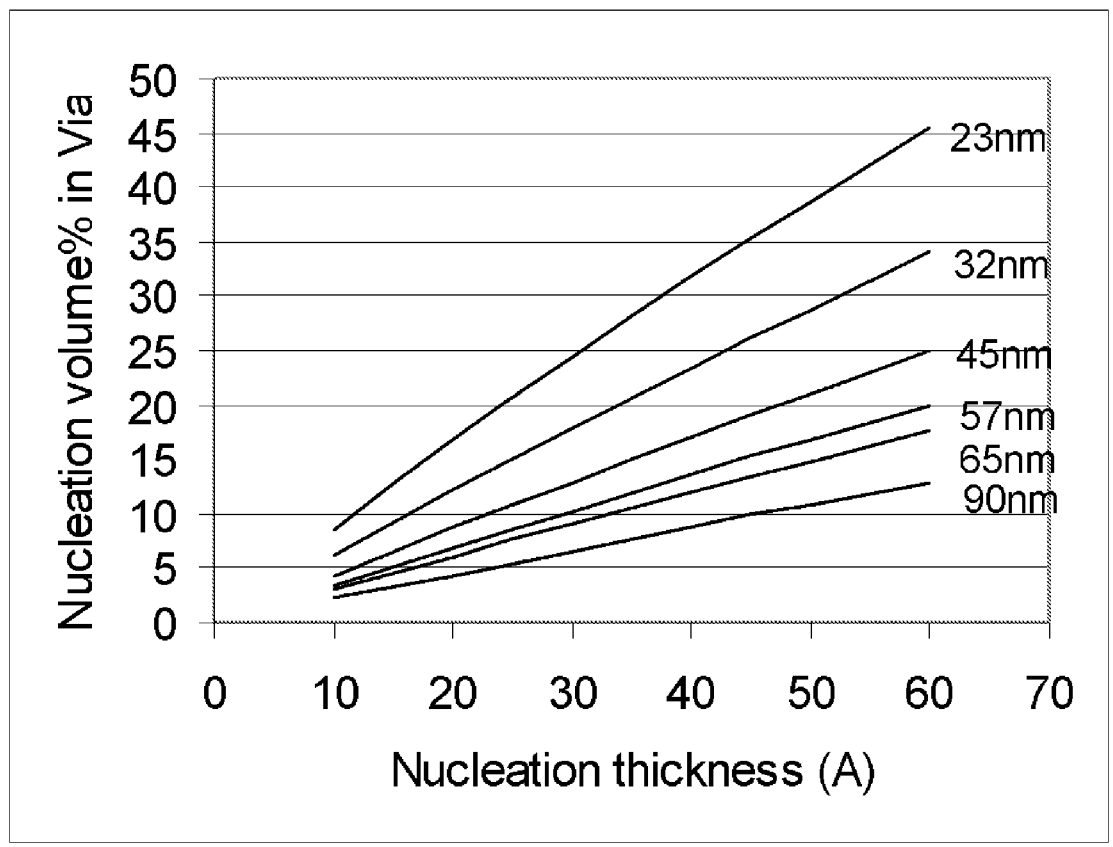
FIG. 1B is a plot showing the nucleation volume percentage of a feature occupied by a nucleation layer as a function of nucleation layer thickness for various feature sizes.

FIG. 1B shows the percent of nucleation volume occupied by the nucleation layer as a function of nucleation thickness for feature widths of 23 nm, 32 nm, 45 nm, 57 nm, 65 nm, and 90 nm. As shown in the graph, nucleation layers occupy a substantially higher percentage of the nucleation by volume in smaller width features than in larger width features. The volume ratio of the nucleation layer becomes more prominent in smaller features with thicker nucleation layers than in larger features. Thus, it becomes important to reduce the nucleation layer thickness (for example, from a 50 Å (angstroms) film to <30 Å) for small features (for example, a feature having a 400 Å opening) or to completely eliminate the nucleation layer to reduce the overall stack resistance. However, conventional deposition methods for standard and low resistivity tungsten processes have a limitation of nucleation layer thickness of around 30 Å to obtain good step coverage and plug fill. Reducing the nucleation layer further using conventional processes results in degradation of the step coverage.

Process

According to various embodiments, provided herein are tungsten fill methods to eliminate use of the nucleation layer altogether, while maintaining excellent plug fill, good uniformity, and decreased, little, or no nucleation delay. Feature 105 in FIG. 1A shows an example of a resulting feature from one embodiment where a feature is filled with only bulk tungsten film, without a nucleation layer, with good plug fill and good uniformity. These films have even lower overall resistance than previously attainable because there is no nucleation layer. This is shown in the below simplified equation describing the total resistance of a tungsten layer:

$$R_{total} = R_{bulk} + R_{nucleation} = \rho_{bulk}(L_{bulk}/A) + \rho_{nucleation}(L_{nucleation}/A)$$

where $R_{total}$ is the total overall resistance, $\rho$ is the resistivity of the material, L is the length of the layer in the direction of the current flow and A is the cross-sectional area perpendicular to current flow. (It should be noted that certain contributions to the total resistance are neglected in the above equation.) Because the $\rho_{nucleation} > \rho_{bulk}$, feature 105 has a lower $R_{total}$ than a feature of the same size that has a nucleation layer. While the benefit to lowering resistance becomes more pronounced as feature size decreases, the methods described herein may be used to deposit tungsten in both small and larger critical dimension features. The methods described herein can also be used to deposit tungsten on blanket or planar wafers.

Figure 2:
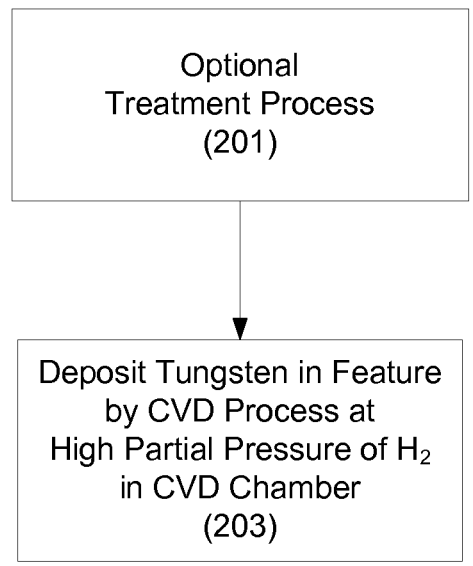
FIG. 2 is a process flow diagram showing relevant operations of methods of depositing tungsten in features according to various embodiments.

FIG. 2 is a process flow diagram depicting one process flow in accordance with certain embodiments. Initially, the substrate is subject to an optional treatment process 201, certain embodiments of which are further discussed below with reference to FIGS. 3 and 5. Examples of treatment processes include thermal soaks in reducing agents and plasma treatments. If performed, the optional treatment process in block 203 can reduce nucleation delay facilitating good fill in the subsequent chemical vapor deposition (CVD) operation.

In many embodiments, the substrate is a partially fabricated electronic device (e.g., a partially fabricated integrated circuit). Specific applications are described further below. The substrate typically contains a feature, which can have a small critical dimension or large critical dimension.

Examples of small critical dimension feature widths are 32 nm, 22 nm, or less than 22 nm. Examples of larger critical dimension feature widths are 45 nm, 57 nm, 65 nm, 90 nm, or greater than 90 nm. Features having either small or large critical dimensions can benefit from this process. While some embodiments are not limited to small critical dimension features, the methods described herein are beneficial to achieving good void-free fill with good uniformity and plug fill in small critical dimension features, for which conventional processes used to fill features in earlier technology nodes do not provide adequate fill.

Next, as indicated by process block 203, a tungsten layer is deposited in the feature using a CVD process at a high partial pressure of $H_2$. In this operation, a tungsten-containing precursor and $H_2$ are flowed into a chamber to deposit a tungsten fill in the feature at a high partial pressure of $H_2$. According to various embodiments, the partial pressure of $H_2$ can be at least about 40 Torr, at least about 50 Torr, at least about 60 Torr, at least about 70 Torr, or at least about 80 Torr. In some embodiments, an inert gas can also be used during the CVD process as a carrier gas. Examples of such inert gases include argon and helium.

CVD processes rapidly produce low resistivity films. Unlike pulsed nucleation layer (PNL) or atomic layer deposition (ALD) processes conventionally used to deposit nucleation layers by introducing alternating pulses of reactants, in the CVD technique, the tungsten-containing precursor and $H_2$ or other reactants are simultaneously introduced into a reaction chamber. Any suitable CVD process may be used with one or more of any suitable precursors. In certain embodiments, the tungsten-containing precursor is a halogen-containing compound, such as tungsten hexafluoride ($WF_6$). Other suitable precursors include tungsten hexafluoride ($WCl_6$), tungsten hexacarbonyl ($W(CO)_6$), and organo-tungsten precursors such as MDNOW (methylcyclopentadienyl-dicarbonylnitrosyl-tungsten) and EDNOW (ethylcyclopentadienyl-dicarbonylnitrosyl-tungsten).

Also unlike PNL or ALD processes, the CVD process generally involves flowing the reactants continuously until the desired amount is deposited. In certain embodiments, the CVD operation may take place in multiple stages, with multiple periods of continuous and simultaneous flow of reactants separated by periods of one or more reactant flows diverted.

The tungsten can be deposited to any thickness. Tungsten interconnects for application in integrated circuits may have a total thickness of between about 20 and 1,000 Angstroms. For a typical bit line, the total tungsten film thickness typically is no more than about 600 Angstroms. The bulk tungsten theoretical film resistivity can be about 5.3 $\mu\Omega$-cm, and a typical film resistivity for a 600 Å film is about 15 to about 20 $\mu\Omega$-cm. After the tungsten film is deposited to a sufficient thickness, the process flow of FIG. 2 is complete.

Using the methods described herein, nucleation layers are no longer required to give good plug fill in tungsten features. As described above, void-free fill with excellent step coverage for tungsten features was previously unattainable without depositing nucleation layers. Overall contact resistance is improved since no high-resistivity nucleation layers are required in depositing tungsten into features with good fill and uniformity.

A series of experiments was conducted to determine the effects of depositing tungsten into features at a high partial pressure of $H_2$. The feature surface was a metal-organic tungsten nitride (MO-WN) layer. The MO-WN layer was deposited using an organo-tungsten precursor in a plasma enhanced ALD process. No optional treatment process was used prior to filling the feature with tungsten by a CVD process. Substrates with features having openings of approximately 40 nm in cross-section (i.e., feature width) were used. The features were filled with tungsten at about 300° C. substrate temperature. Substrates were evaluated at a partial pressure of $H_2$ of 16 Torr, 38 Torr, 63 Torr, and 75 Torr. The total pressure in each evaluation was 80 Torr. The process flows included $H_2$, $WF_6$ and Ar, with a flow rate of 300 sccm of $WF_6$. The flow rate of Ar ranged from 1,000 sccm to 7,000 sccm depending on the partial pressure of $H_2$. The nucleation delays were estimated during the CVD process to determine the time between when the deposition started and when film growth was seen on the feature. The results are shown in Table 1.

TABLE 1

Estimated Nucleation Delays in CVD Processes at Various $H_2$ Partial Pressures without Optional Treatment Process

| Substrate | $H_2$ Partial Pressure (Torr) | Estimated Nucleation Delay (seconds) |
| --- | --- | --- |
| MO-WN | 75 | 20 |
|  | 63 | 30 |
|  | 38 | 40 |
|  | 16 | 75 |

As shown in the results, as the partial pressure of $H_2$ increased, the estimated nucleation delay substantially decreased. A decrease in nucleation delay results in better fill.

Figure 3:
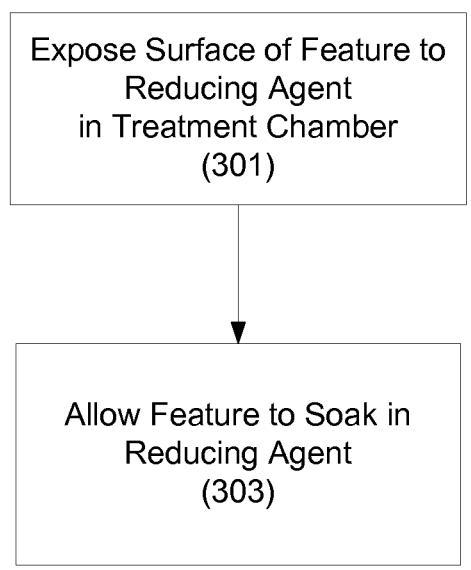
FIG. 3 is a process flow diagram showing relevant operations of methods of treating a feature surface according to various embodiments.

In some embodiments, the optional treatment process 201 can include a reducing agent soak. FIG. 3 is a process flow diagram showing certain operations in such a method. The surface of the feature is exposed to a reducing agent in a treatment chamber as shown in process block 301. Examples of features surfaces are described above with reference to FIG. 1A. Any reducing agent capable of reducing the tungsten-containing precursor may be used. In certain embodiments, the reducing agent is diborane ($B_2H_6$), though other reducing agents may be used including borane ($BH_3$), silane ($SiH_4$), disilane ($Si_2H_6$), germane ($GeH_4$), and other boron-containing, silicon-containing and germane-containing reducing agents. $H_2$ may be used in some embodiments. Such reducing agents can be delivered to the chamber alone or using carrier gases such as argon or helium. It may not be advisable to use nitrogen as it may passivate the surface. Any other suitable carrier gas may also be used.

As shown in block 303, in certain embodiments, the feature is then allowed to soak in the reducing agent. Example soak times range from about 2 to 10 seconds. The soak in process block 301 is typically a thermal soak and can occur at a temperature ranging from about 200° C. to about 500° C. After block 303, the feature may be ready for nucleation layer-free CVD deposition. While FIG. 3 shows an example of process block 201 according to certain embodiments, the treatment process may also be used in some cases to facilitate nucleation layer-free CVD processes that use other reducing agents and/or lower reducing agent partial pressures. According to various embodiments, the partial pressure of $H_2$ or other reducing agent can be at least about 15 Torr, at least about 20 Torr, at least about 30 Torr, at least about 40 Torr, at least about 50 Torr, at least about 60 Torr, at least about 70 Torr, or at least about 80 Torr.

A series of experiments was conducted to determine the effects of soaking the feature in a reducing agent prior to depositing tungsten into the features at a high partial pressure of $H_2$. The type of feature surface used was MO-WN. Substrates with features that have openings of approximately 40 nm in cross-section were used. The features were first exposed to 10 seconds of diborane at a total pressure of 80 Torr in a mixture of Ar/H$_2$ gas. The features were then filled with tungsten by a CVD process as explained in FIG. 2 above at a substrate temperature of about 300° C., and about 300 sccm flow rate of WF$_6$ in an argon and hydrogen environment, at partial pressures of H$_2$ of 63 Torr and 75 Torr. The nucleation delays were estimated during the CVD process to determine the effect of the diborane soaking on nucleation delay. Lower nucleation delay results in better plug fill and uniformity in the feature. The results are shown in Table 2.

TABLE 2

Estimated Nucleation Delays in CVD Processes at High Partial Pressures of H$_2$ after Soaking in B$_2$H$_6$

| Substrate | B$_2$H$_6$ Soaking Total Pressure (Torr) | H$_2$ Partial Pressure (Torr) | Estimated Nucleation Delay (seconds) |
|---|---|---|---|
| MO-WN | 80 | 75 | 1 |
|  | 80 | 63 | 0 |

As shown in Table 2, when the feature was first exposed to soaking by a reducing agent B$_2$H$_6$ and the partial pressure of H$_2$ during the CVD process was raised, the estimated nucleation delay was substantially lower (1 second) or eliminated. This is significantly improved from the technique in Table 1 where at 16 Torr of H$_2$ and with no soaking treatment, the estimated nucleation delay was 75 seconds.

Figure 4:
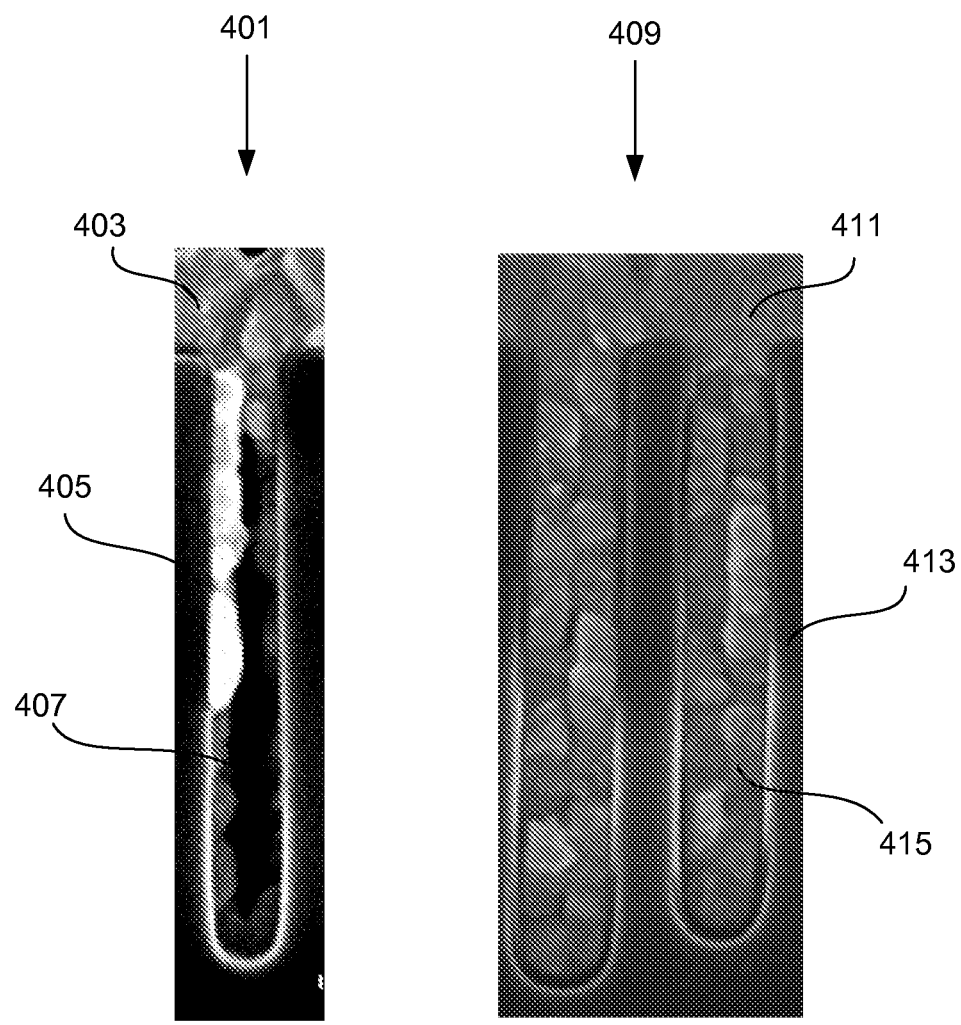
FIG. 4 depicts images of features filled with tungsten at varying hydrogen partial pressures.

FIG. 4 shows SEM (scanning electron microscope) images of an example of other experimental data collected. Both wafer 401 and 409 have an opening of approximately 40 nm in width with an aspect ratio of 6:1. The tungsten was deposited on 30 Å thick MO-WN liners in both features.

Image 401 shows results of a CVD process using WF$_6$ at a partial pressure of H$_2$ of 16 Torr, with no soaking or other pre-CVD treatment. Image 401 shows a substrate 405 with features filled with a tungsten layer 403 and large voids 407. The large voids 407 indicate poor plug fill of tungsten 403 due to longer nucleation delay.

Substrate 413 in image 409 was first exposed to and soaked in B$_2$H$_6$ as described above with reference to blocks 301 and 303 of FIG. 3, and then exposed to WF$_6$ and a high partial pressure of H$_2$ (75 Torr) during a CVD process as described above with reference to block 203 of FIG. 2. The image 409 shows a substrate 413 with features filled with tungsten layer 411 and excellent plug fill as shown in 415 with good uniformity and no gaps.

Figure 5:
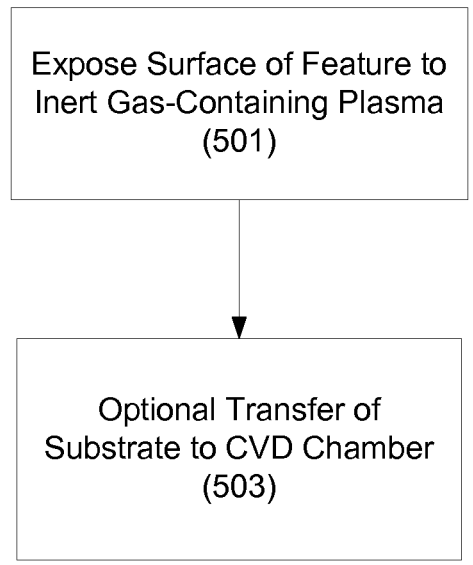
FIGS. 5 and 6 are process flow diagrams showing relevant operations of methods according to various embodiments.

In another embodiment, the optional treatment process 201 in FIG. 2 can include a plasma treatment, an example of which is depicted in FIG. 5. In certain embodiments, the surface of the feature is exposed to an inert gas-containing plasma as shown in process block 501 of FIG. 5. Such exposure can last at least about 5 seconds, at least about 10 seconds, or about 30 seconds. Exposure to inert gas-containing plasma can occur in a treatment chamber. The types of surfaces of features may be the same as those referenced in FIG. 1A. Examples of inert gas-containing plasmas include plasmas generated from argon or helium. It may not be advisable to use nitrogen as it may passivate the surface. Any other suitable inert gas may be used.

In some embodiments, the inert gas-containing plasma may be generated from a gas including H$_2$ or other reducing agent. A reducing agent can be used to eliminate any oxidation on the feature surface. Also, without being bound by a particular theory, it is believed that an H radical may implant on the surface, creating an active site to promote nucleation of the CVD bulk tungsten layer. In some embodiments, the plasma may be generated from a gas consisting essentially of one or more inert gases and hydrogen. In some embodiments, the plasma may be generated from hydrogen without an inert gas. In some embodiments, the pressure during the plasma treatment is about 1 mTorr to about 5 Torr. Substrate temperatures can be between about 25° C. to about 300° C.

Any type of plasma source may be used to create the plasma species. This includes, but is not limited to, inductively coupled plasmas, capacitively coupled plasmas, microwave plasmas, DC (direct current) plasmas, RF (radio frequency) plasmas, and laser created plasmas. The plasma may be downstream or direct (in situ). In some embodiments, the plasma is created by flowing gas through an inductively coupled source in which the plasma acts as the secondary in a transformer. An example of this type of remote plasma source is the Astron, manufactured by MKS. Plasma species are produced within the plasma and are transported to a chamber which contains the wafer or substrate. One embodiment of a chamber apparatus used for in situ plasma treatment is further described with reference to FIG. 9 below.

A series of experiments were conducted to determine the effects of plasma treatment to the surface of a blanket wafer prior to depositing tungsten onto the wafer at a high partial pressure of H$_2$. The types of surfaces treated were MO-WN, WN and TiN liner layers. The MO-WN layers were deposited by a plasma-enhanced ALD process as described above. The WN layers were deposited by a repeating a PNL sequence of B$_2$H$_6$/NH$_3$/WF$_6$. The TiN layers were deposited by a physical vapor deposition (PVD) sputtering process. For each type of substrate, trials were run for the process with and without the plasma treatment step.

Wafers were exposed to an ArH$_2$-containing plasma for 30 seconds at a pressure of 80 Torr and a substrate temperature of 300° C. An inductively coupled plasma source was used. Then tungsten was deposited on the surfaces by a CVD process as explained in FIG. 2 above at about 300° C. substrate temperature, about 300 sccm flow rate of WF$_6$ in an argon and hydrogen environment, where the partial pressure of H$_2$ was about 80 Torr. Surfaces that were used to compare to the plasma treated surfaces were only subject to the CVD process and no plasma treatment. The nucleation delays were estimated during the CVD process to determine the effect of the plasma treatment on nucleation delay. The results are shown in Table 3.

TABLE 3

Estimated Nucleation Delays in CVD Processes at High Partial Pressures of H$_2$ after Plasma Treatment

| Substrate | Plasma Treatment (Type, Time) | H$_2$ Partial Pressure during CVD (Torr) | Estimated Nucleation Delay (seconds) |
|---|---|---|---|
| MO-WN | ArH$_2$, 30 sec | 80 | ~0 |
|  | No Plasma Treatment | 80 | 20 |
| WN | ArH$_2$, 30 sec | 80 | ~20 |
|  | No Plasma Treatment | 80 | 95 |
| TiN | ArH$_2$, 30 sec | 80 | ~20 |
|  | No Plasma Treatment | 80 | ~200 |

As shown in the above results, when the plasma treatment was used prior to the high partial pressure H$_2$ CVD process, the nucleation delay substantially decreased. In the case of metal-organic tungsten nitride subject to ArH$_2$ plasma treatment, the nucleation delay was essentially eliminated, which results in good uniformity with low resistance overall.

Returning to FIG. 5, after the exposure to plasma treatment in 501, the substrate is then optionally transferred to a CVD chamber in process block 503 for the CVD process 203 explained in FIG. 2. An example apparatus for this embodiment is further explained below with reference to FIG. 7. In certain embodiments, the transfer takes place under vacuum to prevent oxidation due to exposure to ambient conditions. In certain embodiments where the substrate is not transferred to a CVD chamber, the substrate can remain under vacuum between the plasma treatment operation 501 and the CVD process 203, with the CVD process 203 occurring in the same chamber as the plasma treatment operation.

Figure 6:
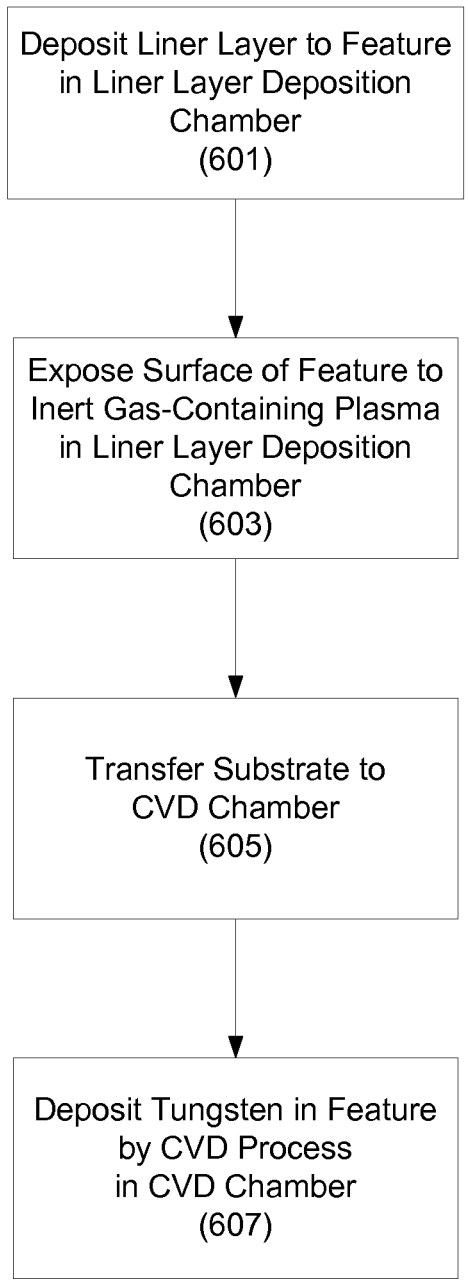

FIG. 6 shows a process flow diagram depicting another embodiment. First, in operation 601, a liner layer is deposited into the feature in a liner layer deposition chamber. One embodiment of such a chamber is described below with reference to FIG. 9.

In certain embodiments, the liner layer may be a barrier layer such as a tungsten nitride barrier layer. In certain embodiments, a liner may be deposited to protect a dielectric or other under-layer to protect against $F_2$ attack at the feature corner during the subsequent CVD deposition. Examples of liner layers include oxides, nitrides, and tungsten and non-tungsten elemental metal layers. Specific examples of liner layers include W, Ti/TiN, TiN and WN. The liner layer may be between about 10 Å and 500 Å thick, or, in more specific embodiments, between about 25 Å and 200 Å thick.

In certain embodiments, an MO-WN barrier layer is deposited by a plasma-enhanced ALD process in operation 601. Depositing a MO-WN layer by the plasma-enhanced process may involve alternating pulses of an organo-tungsten precursor and a nitrogen-containing reactant, such as ammonia. An in situ plasma may be struck while the nitrogen-containing reactant is in the vapor phase. In other embodiments, depositing a MO-WN layer by the plasma-enhanced process may involve pulsing a nitrogen-containing organotungsten precursor. A reducing agent such as hydrogen can be pulsed between the precursor pulses or run continuously during the process. An in situ plasma may be struck between organotungsten precursor pulses when hydrogen is in the gas phase.

Next, in operation 603, the surface of the feature, which is now lined with a liner layer, is exposed to an inert gas-containing plasma in the liner layer deposition chamber. That is, the liner layer and the subsequent plasma treatment are performed in the same chamber. Suitable conditions for the plasma treatment are discussed above with reference to FIG. 5. One embodiment of the apparatus to be used during the plasma treatment is further discussed below with reference to FIG. 9.

Then in operation 605, the substrate is transferred from the liner layer deposition chamber to the CVD chamber under vacuum. One embodiment of the apparatus to be used during such a transfer is further described with reference below to FIG. 7.

Returning to FIG. 6, in operation 607, tungsten is then deposited into the lined and treated feature by the CVD process by exposing the feature to a tungsten-containing precursor and a reducing agent. The conditions for this CVD process are described above with reference to FIG. 2. In certain embodiments, the partial pressure of $H_2$ is at least about 40 Torr, or at least about 50 Torr, or at least about 60 Torr, or at least about 70 Torr, or at least about 80 Torr.

Experimental data was collected for one embodiment of the process in FIG. 6. Trials were run for the process on blanket wafers including the plasma treatment step and then for the process excluding the plasma treatment step. First, a metal-organic tungsten nitride liner layer was deposited onto the wafer in a liner layer deposition chamber. After the liner layer deposition, wafers were exposed to in situ plasma treatment containing argon (Ar) and hydrogen ($H_2$) for 30 seconds at a pressure of 2 Torr and a substrate temperature of 300° C. in the liner layer deposition chamber. The substrate was then transferred to the CVD chamber under vacuum to complete the CVD process. Then tungsten was deposited on the wafers by a CVD process as explained in FIG. 2 at about 300° C. substrate temperature, about 300 sccm total flow rate of $WF_6$ in an argon (Ar) and hydrogen ($H_2$) environment, where the high partial pressure of $H_2$ was about 80 Torr. The second column of Table 4 identifies the type of plasma used after the liner layer deposition was complete. Wafers that were used to compare to the plasma treated wafers were only subject to the CVD process and no plasma treatment. The nucleation delays were estimated during the CVD process to determine the effect of the plasma treatment on nucleation delay. The results are shown in Table 4.

TABLE 4

In situ Plasma Treatment on MO-WN Substrates and Tungsten Fill by CVD at High Partial Pressure of $H_2$

| Substrate | In situ Post-Deposition Plasma Treatment | $H_2$ Partial Pressure during CVD (Torr) | Estimated Nucleation Delay (seconds) |
|---|---|---|---|
| MO-WN | Ar/$H_2$ Plasma | 80 | 5 |
|  | No Plasma Treatment | 80 | 40 |

As shown in Table 4, the nucleation delay substantially decreased when the wafer was exposed to plasma treatment versus when the wafer was not exposed to plasma treatment. The nucleation delay with plasma treatment was 8 times lower than the nucleation delay without such treatment, and lower nucleation delay results in good uniformity, and lower overall resistance of the wafer.

Apparatus

The methods presented herein may be carried out in various types of deposition apparatuses available from various vendors. Examples of a suitable apparatus include a Novellus Concept-1 ALTUS™, a Concept 2 ALTUS™, a Concept-2 ALTUS-S™, Concept 3 ALTUS™ deposition system, and ALTUS Max™ or any of a variety of other commercially available CVD tools. In some cases, the process can be performed on multiple deposition stations sequentially. See, e.g., U.S. Pat. No. 6,143,082, which is incorporated herein by reference.

In some embodiments where the optional treatment step is not elected, a single station or single chamber can be used to deposit tungsten into the feature for the CVD process. Alternatively, a substrate or wafer may be indexed to have the CVD operations performed over two or more stations sequentially if needed.

In some embodiments where a soaking treatment step occurs before the CVD process, the reducing agents and corresponding gases relevant to the soaking step can be first introduced to the surface of the semiconductor substrate at the first station, using an individual gas supply system that creates a localized atmosphere at the substrate surface. Then a second station may be used to complete the tungsten fill deposition by a CVD process, and a tungsten-containing precursor and hydrogen gas at a high partial pressure are introduced to the surface of the feature using an individual gas supply system that creates a localized atmosphere at the substrate surface. Alternatively, both the soaking treatment step and the tungsten fill by a CVD process can occur in the same chamber or same station and the apparatus is configured to change the relevant gases introduced into the chamber or station.

In some embodiments where a plasma treatment step occurs before the CVD process, the inert-gas containing plasma, corresponding carrier gases and other gases are introduced to the surface of the semiconductor substrate at a first station. One embodiment of an apparatus used for plasma treatment in a treatment chamber is further described below with reference to FIG. 9. Then the substrate may be optionally transferred to a CVD station or chamber to complete the tungsten fill deposition by a CVD process while a tungsten-containing precursor, hydrogen gas, and potential other carrier gases are introduced to the surface of the feature using an individual gas supply system that creates a localized atmosphere at the substrate surface. One embodiment of a CVD apparatus is further described below with reference to FIG. 8.

In some embodiments, a downstream plasma apparatus including a plasma generator may be used. A showerhead or other gas inlet can separate the plasma generator and an exposure area of the treatment chamber. Sources of gas provide a flow of gas into the plasma generator.

In some embodiments, the plasma generator includes induction coils connected to a power source. During operation, gas mixtures are introduced into the plasma generator, with induction coils energized, and plasma is generated in the plasma generator. In embodiments in which a showerhead assembly is used, the assembly may have an applied voltage. The assembly may terminate the flow of some or substantially all ions and allow the flow of neutral species such as radicals into the treatment chamber.

In some embodiments, the plasma is created by flowing gas through an inductively coupled source in which the plasma acts as the secondary in a transformer. An example of this type of remote plasma source is the Astron manufactured by MKS. Reactive species are produced within the plasma and are transported to a chamber which contains the wafer. In some embodiments, ionic species are not introduced from the remote plasma source.

In some embodiments, a liner layer is deposited at a first station that is one of two, five or even more deposition stations positioned within a single deposition chamber. Then the plasma treatment step is carried out at the first station such that the inert gas-containing plasma, potential carrier gases, and other gases are introduced to the surface of the semiconductor substrate at that first station where the liner layer was deposited. Then the substrate may be transferred to a second station under vacuum to complete the tungsten deposition by a CVD process where hydrogen gas and a tungsten-containing precursor, along with other carrier gases if used are introduced to the surface of the feature using an individual gas supply system that creates a localized atmosphere at the substrate surface.

In other embodiments, a liner layer is deposited at a first chamber that is one of two or more chambers positioned within the apparatus. Then the transfer after the plasma treatment step would occur from the first chamber to a second chamber under vacuum such that the tungsten deposition by CVD process occurs in the second chamber.

Figure 7:
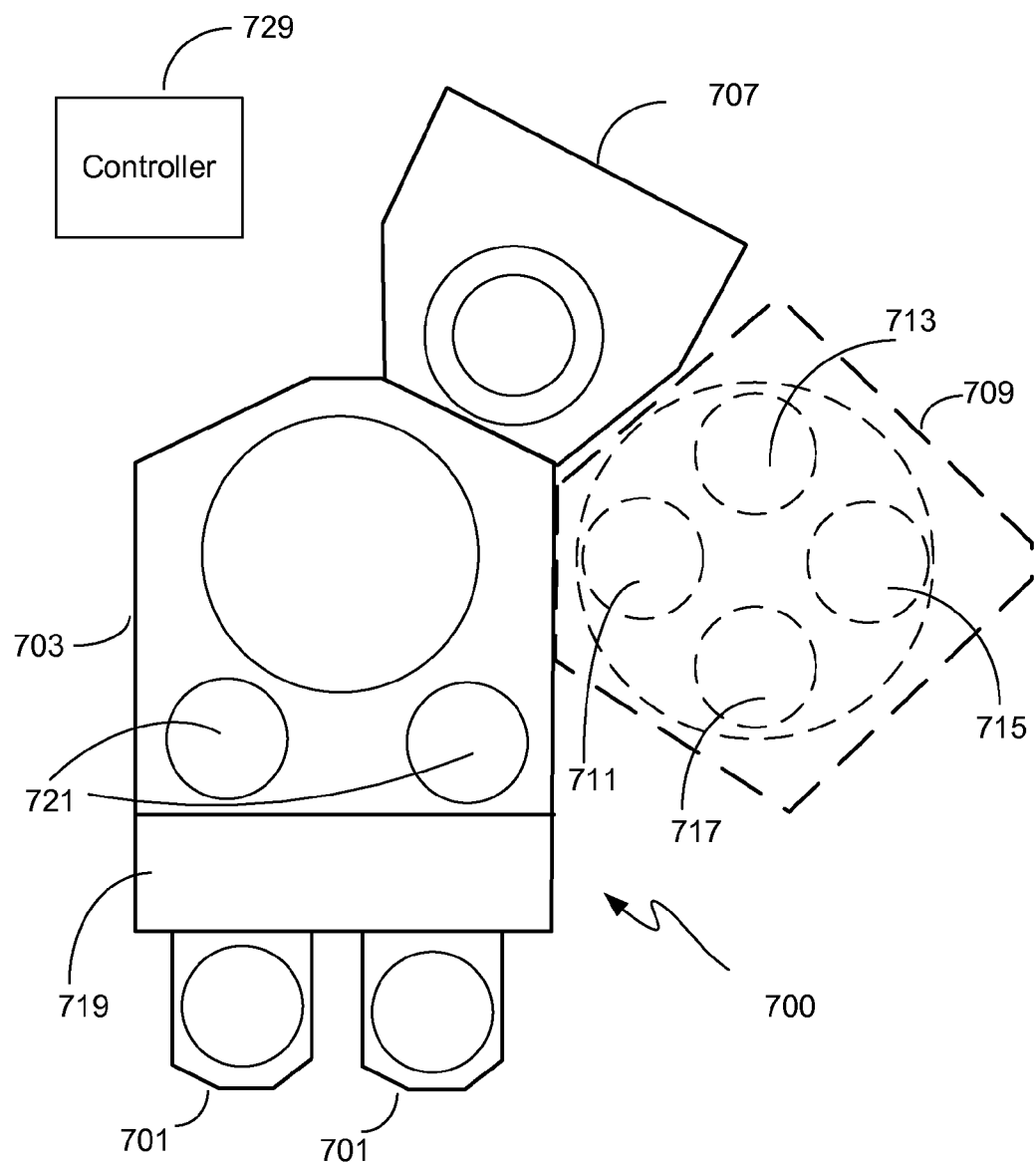
FIG. 7 is a schematic illustration of a processing system suitable for conducting a tungsten deposition process according to various embodiments.
Figure 8:
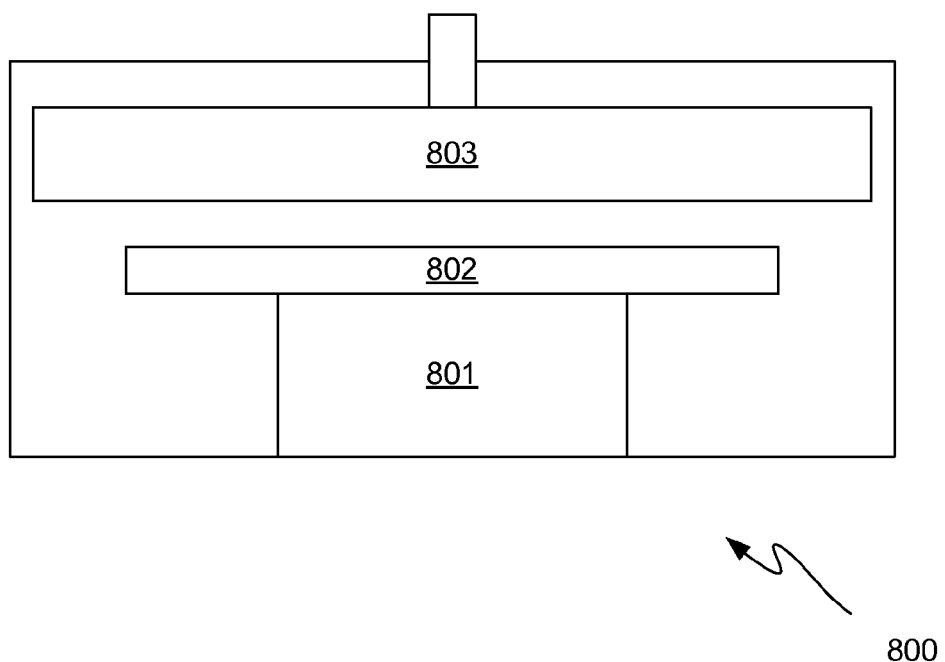
FIG. 8 is a schematic illustration of a depositing and/or treatment chamber or station suitable for practicing various embodiments.

FIG. 7 is a block diagram of a processing system suitable for conducting tungsten thin film deposition processes in accordance with various embodiments. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing substrate soaking, liner layer deposition if desired, and CVD, according to some embodiments. Chamber 709 may include multiple stations 711, 713, 715, and 717 that may sequentially perform these operations. For example, chamber 709 could be configured such that station 711 performs liner layer deposition, station 713 performs soaking, and stations 715 and 717 perform CVD. Each deposition station includes a heated wafer/substrate pedestal and a showerhead, dispersion plate or other gas inlet. An example of a deposition station 800 is depicted in FIG. 8, including wafer support 802 and showerhead 803. A heater may be provided in pedestal portion 801. The apparatus in FIG. 8 also depicts an example of a chamber if certain steps of the some embodiments are carried out in chambers within a single module 707.

Also mounted on the transfer module 703 may be one or more single or multi-station modules 707 capable of performing plasma or chemical (non-plasma) treatment or pre-cleans. The module may also be used for various other treatments, e.g., tungsten nitride or other liner layer deposition or post-liner tungsten nitride CVD. The system 700 also includes one or more (in this case, two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit, not shown) in the transfer module 703 moves the wafers from loadlocks 721 to and among the modules mounted on the transfer module 703.

In certain embodiments, a system controller 729 is employed to control process conditions during deposition. The controller will typically include one or more memory devices and one or more processors. The processor may include a CPU or computer, analog and/or digital input/output connections, stepper motor controller boards, etc.

The controller 729 may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions, such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of some embodiments in a single or multi-chamber semiconductor processing tool.

Figure 9:
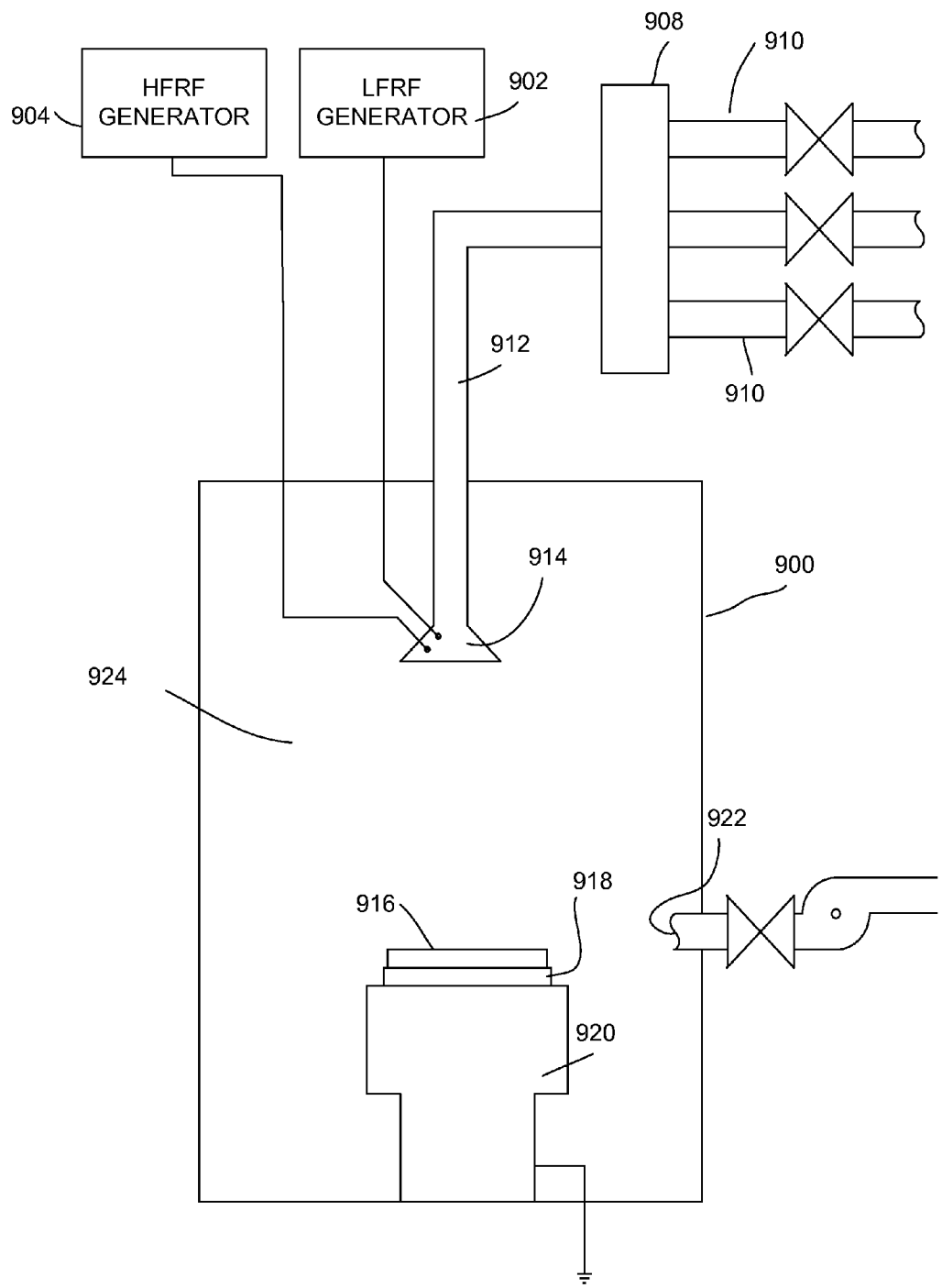
FIG. 9 is a schematic illustration of a deposition and/or treatment chamber suitable for practicing various embodiments.

FIG. 9 shows an example of a reactor that may be used in accordance with certain embodiments, as a treatment chamber, a deposition chamber, or a treatment and deposition chamber. The reactor shown in FIG. 9 is suitable for either the dark (non-plasma) or plasma-enhanced deposition, for example, by capacitively-coupled plasma anneal. As shown, a reactor 900 includes a process chamber 924, which encloses other components of the reactor and serves to contain the plasma generated by a capacitor type system including a showerhead 914 working in conjunction with a grounded heater block 920. A low-frequency RF generator 902 and a high-frequency RF generator 904 are connected to showerhead 914. The power and frequency are sufficient to generate plasma from the process gas, for example 50 W-5 kW total energy. During the plasma treatment step, one or both generators may be used. For example, in a typical process, the high frequency RF component is generally between 2-60 MHz, for example 13.56 MHz.

Within the reactor, a wafer pedestal 918 supports a substrate 916. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 912. Multiple source gas lines 910 are connected to manifold 908. The gases may or may not be premixed. In some embodiments, the temperature of the mixing bowl or manifold lines can be maintained at levels above the reaction temperature. Temperatures at or above about 100° C. usually suffice. Appropriate valving and mass flow control mechanisms are employed to ensure that the correct gases are delivered during the deposition and plasma treatment phases of the process. In case the chemical reactant(s) is delivered in the liquid form, liquid flow control mechanisms are employed. The liquid is then vaporized and may be mixed with other process gases during its transportation in a manifold heated above its vaporization point before reaching the deposition chamber.

Process gases exit chamber 900 via an outlet 922. A vacuum pump (e.g., a one or two stage mechanical dry pump and/or a turbomolecular pump) typically draws process gases out and maintains a suitably low pressure within the reactor by a closed loop controlled flow restriction device, such as a throttle valve or a pendulum valve.

Applications

The present embodiments may be used to deposit thin, low-resistivity tungsten layers for many different applications. One application is vias, contacts, and other tungsten structures commonly found in electronic devices. Another application is for interconnects in integrated circuits, such as memory chips and microprocessors. Interconnects are current lines found on a single metallization layer and are generally long thing flat structures. A primary example of an interconnect application is a bit line in a memory chip. Generally, the disclosed embodiments find application in any environment where thin, low-resistivity tungsten layers are required.

The disclosed embodiments is also focus on low-resistivity, tungsten layers having relatively thin proportions, typically on the order of 2,000 angstroms or less, for example, 1,000 angstroms or less. But more generally, the disclosed embodiments apply to a broader range of tungsten layers, including those with thicknesses of between about 5 angstroms to 5,000 angstroms.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of filling a recessed feature on a substrate, the method comprising:
    prior to depositing any tungsten in the feature, treating a surface of the feature with a non-nitrogen-containing chemistry; and
    without depositing a nucleation layer, filling the feature with a tungsten film in a chemical vapor deposition (CVD) process by directly exposing the treated surface to a tungsten-containing precursor and hydrogen,
    wherein the partial pressure of hydrogen is at least about 40 Torr during the CVD process.

2. The method in claim 1, wherein the width of the feature is less than about 50 nm.

3. The method in claim 1, wherein the feature surface comprises tungsten.

4. The method in claim 1, wherein the feature surface comprises tungsten nitride.

5. The method in claim 1, wherein the feature surface comprises titanium nitride.

6. The method in claim 1, wherein the partial pressure of hydrogen is at least about 60 Torr during the CVD process.

7. The method in claim 1, wherein the partial pressure of hydrogen is at least about 80 Torr during the CVD process.

8. The method in claim 1, wherein treating the surface of the feature comprises soaking the substrate in a reducing agent.

9. The method in claim 8, wherein the reducing agent is a borane, a silane, or a germane.

10. The method in claim 1, wherein treating the surface of the feature comprises exposing the substrate to an inert gas-containing plasma.

11. The method in claim 10, wherein the inert gas-containing plasma comprises argon and hydrogen species.

12. The method in claim 10, wherein the substrate is kept under vacuum between treating the surface of the feature and filling the feature with a tungsten film in the CVD process.

13. A method of filling a recessed feature on a substrate, the method comprising:
  prior to depositing any tungsten in the feature,
  exposing a surface of the feature to a non-nitrogen inert gas-containing plasma; and
  without depositing a nucleation layer, filling the feature with tungsten in a chemical vapor deposition (CVD) process by directly exposing the treated surface to a tungsten-containing precursor and a reducing agent in a CVD chamber.

14. The method in claim 13, wherein the substrate comprises at least one of tungsten, tungsten nitride and titanium nitride.

15. The method in claim 13, wherein the substrate is kept under vacuum between the plasma treatment and the CVD process.

16. The method in claim 13, wherein exposing the surface of the feature to an inert gas-containing plasma occurs in a treatment chamber separate from the CVD chamber.

17. The method in claim 13 further comprising,
  prior to the plasma treatment,
  depositing a liner layer in the feature in a liner layer deposition chamber,
  wherein exposing the surface of the feature to an inert gas-containing plasma occurs in the liner layer deposition chamber; and
  transferring the substrate to the CVD chamber.

18. A method of filling a recessed feature on a substrate, the method comprising:
  prior to depositing any tungsten in the feature, treating a surface of the feature with a non-nitrogen-containing chemistry; and
  filling the feature with a tungsten film by directly exposing the treated surface to a tungsten-containing precursor and hydrogen in a chemical vapor deposition (CVD) process,
  wherein the partial pressure of hydrogen is at least about 40 Torr during the CVD process, and
  wherein hydrogen is the predominant reducing agent during the CVD process.

19. The method in claim 18, wherein the partial pressure of hydrogen is at least about 60 Torr during the CVD process.

* * * * *